United States Patent
Shu et al.

(10) Patent No.: US 6,646,862 B1
(45) Date of Patent: Nov. 11, 2003

(54) DYNAMIC CIRCUIT INTERFACE

(75) Inventors: Thomas B. Shu, Austin, TX (US); Kevin Y. Chen, Round Rock, TX (US)

(73) Assignee: Dell Products L.P., Round Rock, TX (US)

(*) Notice: Subject to any disclaimer, the term of this patent is extended or adjusted under 35 U.S.C. 154(b) by 0 days.

(21) Appl. No.: 10/160,760

(22) Filed: May 31, 2002

(51) Int. Cl.[7] .................................................. H05K 7/16
(52) U.S. Cl. ..................... 361/679; 361/727; 364/708.1; 248/922
(58) Field of Search ................................ 361/679–687, 361/724–727; 364/708.1; 70/50, 280–282; 248/917–923; 200/5–10

(56) References Cited

U.S. PATENT DOCUMENTS 5,390,075 A * 2/1995 English et al. .............. 361/683
5,757,616 A * 5/1998 May et al. ................... 361/726
6,388,878 B1 * 5/2002 Chang ......................... 361/687

* cited by examiner

Primary Examiner—Darren Schuberg
Assistant Examiner—Hung Van Duong
(74) Attorney, Agent, or Firm—Baker Botts L.L.P.

(57) ABSTRACT

An information handling system including a dynamic circuit interface is disclosed. The information handling system may include a processor mounted on a circuit board and a connector provided on the circuit board and electrically coupled to the processor. The connector is configured to receive a first circuit card or a second circuit card. A first circuit is provided on the circuit board and is electrically coupled to the connector, and a second circuit is provided on the circuit board and is also electrically coupled to the connector. If the first circuit card is received by the connector, a first signal path is provided from the first circuit to the second circuit via the first circuit card. If the second circuit card is received by the connector, a second signal path is provided from the second circuit card to the second circuit.

23 Claims, 6 Drawing Sheets

(First Circuit Card)

DYNAMIC CIRCUIT INTERFACE

BACKGROUND OF THE INVENTION

1. Field of the Invention

This invention relates generally to the field of circuit interfaces, and more particularly to circuit interfaces which support both internal and external graphics configurations.

2. Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems, and portable systems. Additionally, information handling systems may be configured to support multiple graphics configurations.

One common problem that many designers and manufacturers of information handling systems encounter is the challenge of providing multiple configurations of information handling systems in light of the large number of components that are used to configure them. For example, there are currently a wide variety of graphics adapters which provide graphics support for displays used in information handling systems. Two such graphics adapters include the ATI Rage graphics adapter which includes Accelerated Graphics Port (AGP) support, and the Intel 830M chipset, which may not provide AGP support. Configuring an information handling system with one of these graphics adapters is not as easy as selecting the adapter and chip. Other considerations must be made because not all of the graphics adapters operate on similar, or even compatible, technologies.

One solution of providing support for the various graphics adapters for use in an information handling system is to provide a single motherboard for each graphics adapter, and/or graphics chip supported technology. For example, if a user wanted an information handling system with internal graphics support and without AGP support (e.g. the intel 830M chipset), a first motherboard would be used to build such an information handling system. However, if the same or another user desired an information handling system with external graphics support including AGP support (e.g. the ATI Rage graphics adapter), a second motherboard would be used.

Problems associated with the above solution, however, include the need to design, build, and support multiple motherboards. Additionally, there is the need to inventory the different motherboards as well as the need to provide a manufacturing process which takes into account the different motherboards for a given information handling system. This can increase the costs associated with the design and manufacture of the information handling system.

For the foregoing reasons, there is the need for an apparatus which provides for the dynamic configuration of a number of graphics adapters on the same motherboard.

SUMMARY OF THE INVENTION

The present invention generally provides a circuit interface for dynamically interfacing multiple circuits electrically coupled to a motherboard, thus eliminating the need to provide a separate motherboard for each circuit.

In an embodiment of the present invention, an information handling system is disclosed. The information handling system includes a processor mounted on a circuit board and a connector provided on the circuit board and electrically coupled to the processor. The connector is configured to receive a first circuit card or a second circuit card. A first circuit is provided on the circuit board and is electrically coupled to the connector, and a second circuit is provided on the circuit board and is also electrically coupled to the connector. If the first circuit card is received by the connector, a first signal path is provided from the first circuit to the second circuit via the first circuit card. If the second circuit card is received by the connector, a second signal path is provided from the second circuit card to the second circuit.

In another embodiment of the present invention, a circuit interface is disclosed. The circuit interface includes a connector provided on a circuit board configured to receive a first circuit card and a second circuit card, a first circuit is provided on the circuit board and electrically coupled to the connector, and a second circuit is provided on the circuit board and electrically coupled to the connector. If the first circuit card is inserted in the connector, a first signal path is provided from the first circuit to the second circuit via the first circuit card, and if the second circuit card is inserted into the connector, a second signal path is provided from the second circuit card to the second circuit.

The advantages of these and other embodiments, include the ability to interface multiple circuits on a single motherboard. By using only one motherboard, the cost associated with designing and supporting a system utilizing the motherboard is decreased, as is the cost associated with maintaining the inventory of motherboards. Further, the efficiency of a manufacturing process for building an information handling system utilizing such a motherboard is improved.

The foregoing is a summary and thus contains, by necessity, simplifications, generalizations and omissions of detail; consequently, those skilled in the art will appreciate that the summary is illustrative only and is not intended to be in any way limiting. Other aspects, inventive features, and advantages of the present invention, as defined solely by the claims, will become apparent in the non-limiting detailed description set forth below.

BRIEF DESCRIPTION OF THE DRAWINGS

The use of the same reference symbols in different drawings indicates similar or identical items.

DETAILED DESCRIPTION OF THE INVENTION

The present invention is generally directed to a circuit interface for dynamically interfacing any of multiple circuits coupled to a motherboard, thus eliminating the need to provide a separate motherboard for each circuit.

For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Figure 1:
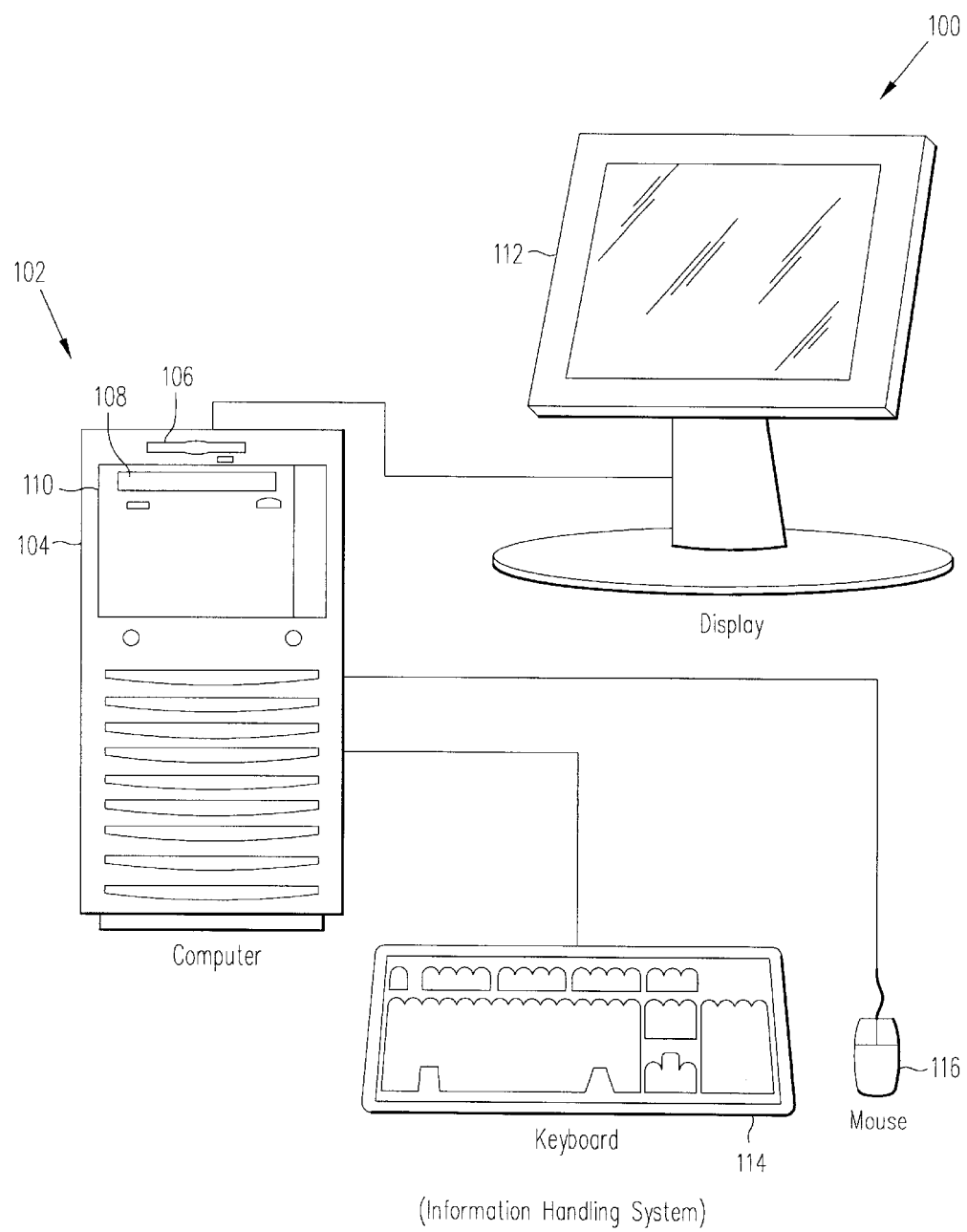
FIG. 1 illustrates a portable information handling system incorporating an embodiment of the present invention.

Turning now to the figures, FIG. 1 illustrates one type of information handling system for use with an embodiment of the present invention. The information handling system 100 includes a computer 102 having a computer housing 104. Computer 102 includes one or more central processing units (not shown), one or more motherboards (not shown), and one or more graphics adapters (not shown). Computer 102 further includes a floppy disk drive 106 and a media bay 108. Media bay 108 includes storage media (not shown) for storing software or other code which can be executed on computer 102. Media bay 108 includes aCD ROM drive 110 and other media storage drives (e.g. hard disk drives, not shown). Information handling system 100 further includes a display 112, a keyboard 114, and a mouse 116. Information handling system 100 may also include other input and output devices in addition to those shown in FIG. 1. For example, information handling system 100 can include a printer (not shown), speakers (not shown), a microphone (not shown), a tablet (not shown), a touch pad (not shown), and/or a touch screen (not shown).

Figure 2:
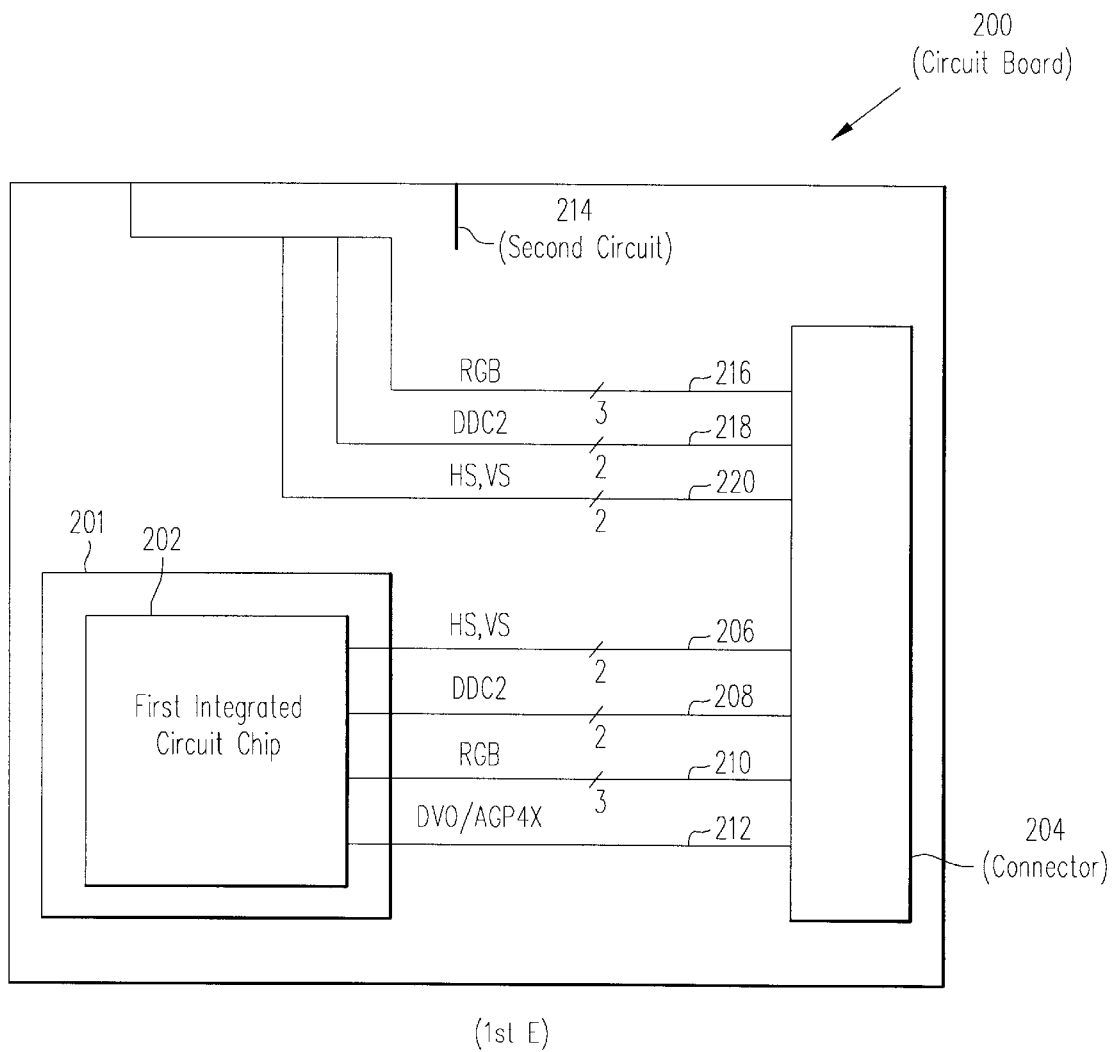
FIG. 2 is a block diagram illustrating a circuit board including a connector in accordance with one embodiment of the present invention.

FIG. 2 illustrates a circuit board that can be used in information handling system 100 of FIG. 1. The circuit board employs one embodiment of the invention. The illustrated circuit board includes a connector that can be used to provide a dynamic interface for a number of circuits on the same circuit board.

circuit board 200 includes a first circuit 201 including a first integrated circuit (IC) chip 202 electrically coupled to a board connector 204. In one embodiment of the present invention, first chip 202 is a graphics memory controller hub chip (GMCH chip) for the Intel 830M chipset. However, first chip 202 may also be any other IC chip. The present invention will be explained by reference to first chip 202 embodied in the GMCH chip described above, it being understood that the present invention should not be limited thereto. Board connector 204 is a coupling device employed to electrically couple one circuit device (e.g. first circuit card 400 of FIG. 4 or second circuit card 500 of FIG. 5) to one or more other circuit devices (e.g. first chip 202 and/or second circuit 214).

First chip 202 is electrically coupled to board connector 204 via conductive lines for transmitting signals 206, 208, 210, and 212. Signals 206, 208, 210, and 212 control a display electrically coupled to circuit board 200. Board connector 204 is also electrically coupled to second circuit 214 via conductive lines for transmitting signals 216, 218, and 220, which are similar to signals 210, 208, and 206 respectively. In one embodiment, second circuit 214 is a display connector that provides a connection for a display to connect to circuit board 200. Those of ordinary skill in the art will recognize that the term signals may refer to an individual signal or a group of signals. For example, in the present embodiment, signal 212 is a group of signals (i.e. a bus).

Figure 3:
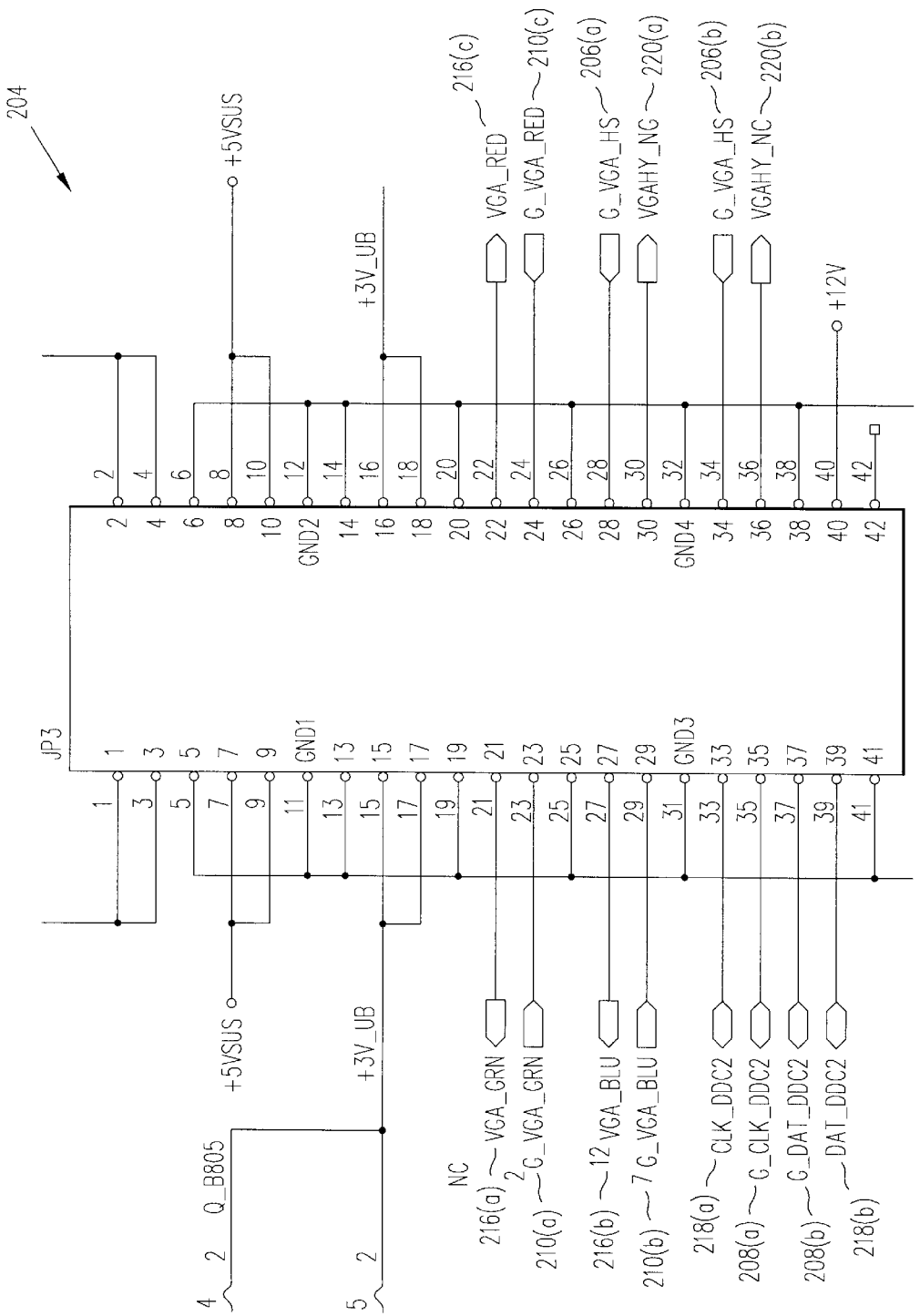
FIG. 3 is schematic diagram illustrating the connections of a connector in accordance with an embodiment of the present invention.

FIG. 3 is a schematic diagram illustrating the conductive lines of board connector 204 in accordance with an embodiment of the present invention. Board connector 204 enables second circuit 214 to receive data from either first chip 202 or a second IC chip (e.g. second chip 502 of FIG. 5), depending on the circuit card (not shown) inserted into board connector 204. Board connector 204 includes conductive lines for transmitting signals 206, 208, and 210 received from first circuit 201. Board connector 204 further includes conductive lines for transmitting signals 216, 218, and 220 to second circuit 214.

Figure 4:
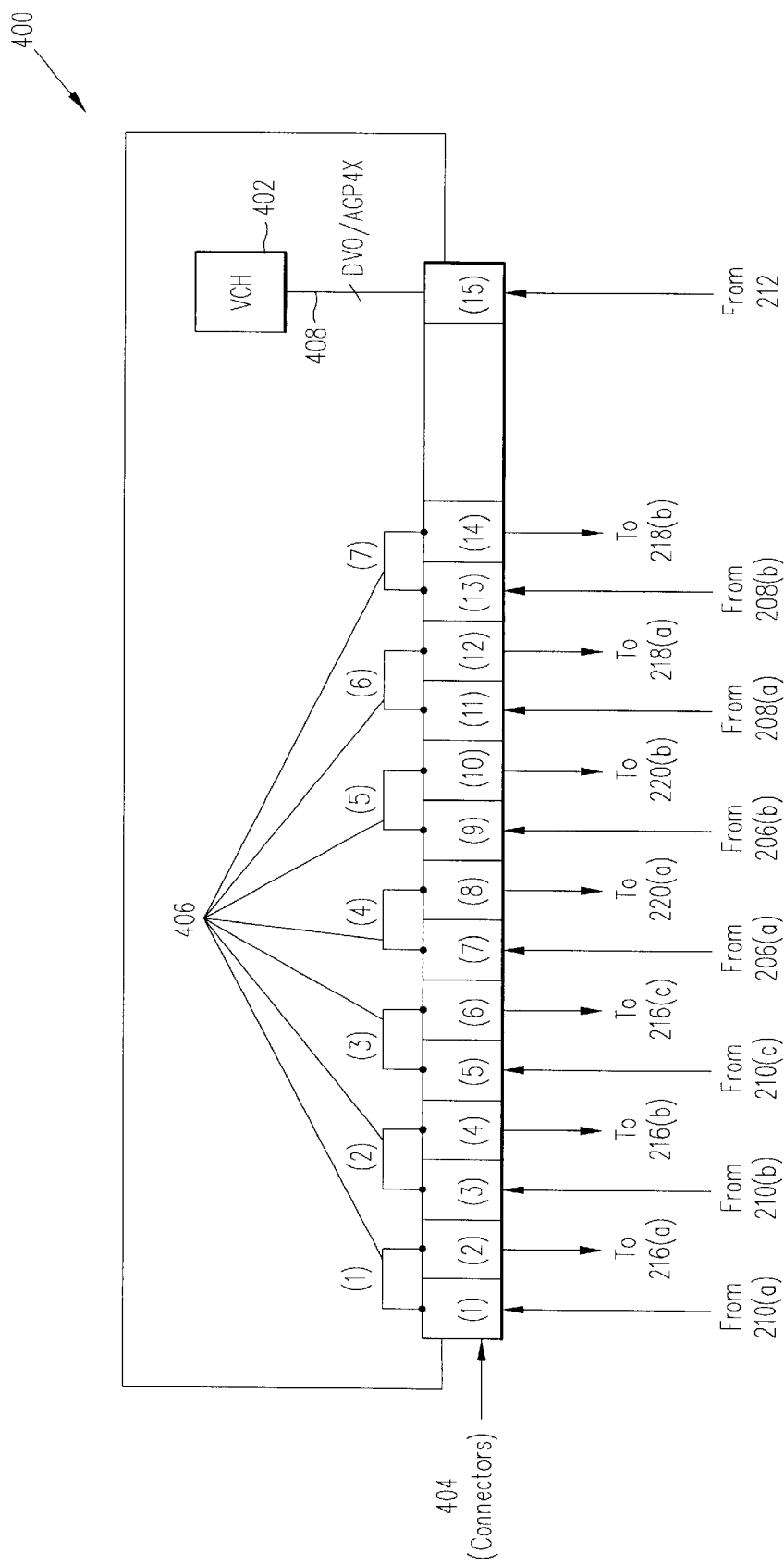
FIG. 4 is a schematic diagram illustrating a first circuit card for use in accordance with another embodiment of the present invention.

FIG. 4 is a schematic diagram illustrating a first circuit card that can be used in board connector 204 to electrically couple first circuit 201 to second circuit 214. First circuit card 400 includes video controller hub (VCH) chip 402 and board connectors 404(1–15). VCH chip 402 is used to control a display electrically coupled to second circuit 214. Connectors 404(1–15) electrically couple with the conductive lines of board connector 204 when inserted into board connector 204. For example, connector 404(1) is electrically coupled with conductive line 210(a) of FIG. 2 when first circuit card 400 is inserted into board connector 204. As mentioned above , in one embodiment, connectors 404 may be connectors for use in a flat board connector (i.e., flat board connectors) and board 204 may be a flat board connector. However, in another embodiment, connectors 404 may be pin connectors while board connector 204 may be a cable connector which accepts the pin connectors.

Conductive lines 406(1–7) electrically couple individual connectors 404(1–15) to specific other individual connectors 404(1–15) to allow signals from first chip 202 to pass through to second circuit 214. As illustrated in FIG. 4, connector 404(1) is electrically coupled to connector 404(2) via conductive line 406(1), connector 404(3) is electrically coupled to connector 404(4) via conductive line 406(2), connector 404(5) is electrically coupled to connector 404(6) via conductive line 406(3), connector 404(7) is electrically coupled to connector 404(8) via conductive line 406(4), connector 404(9) is electrically coupled to connector 404 (10) via conductive line 406(5), connector 404(11) is electrically coupled to connector 404(12) via transmission line 406(6), and connector 404(13) is electrically coupled to connector 404(14) via conductive line 406(7). Connector 15 is electrically coupled to transmission line for signal 212 and VCH chip 402 via conductive line for transmitting signal 408.

As further illustrated in FIG. 4, when electrically coupled to board connector 204, connectors 404 are electrically coupled to certain conductive lines of board connector 204. For example, connector 404(1) connects to conductive line for signal 210(a) and 404(2) connects to conductive line for signal 216(a). Further, for example, since connectors 404(1) and 404(2) are electrically coupled to each other, conductive line for signal 210(a) and conductive line for signal 216(a) are electrically coupled together.

Figure 5:
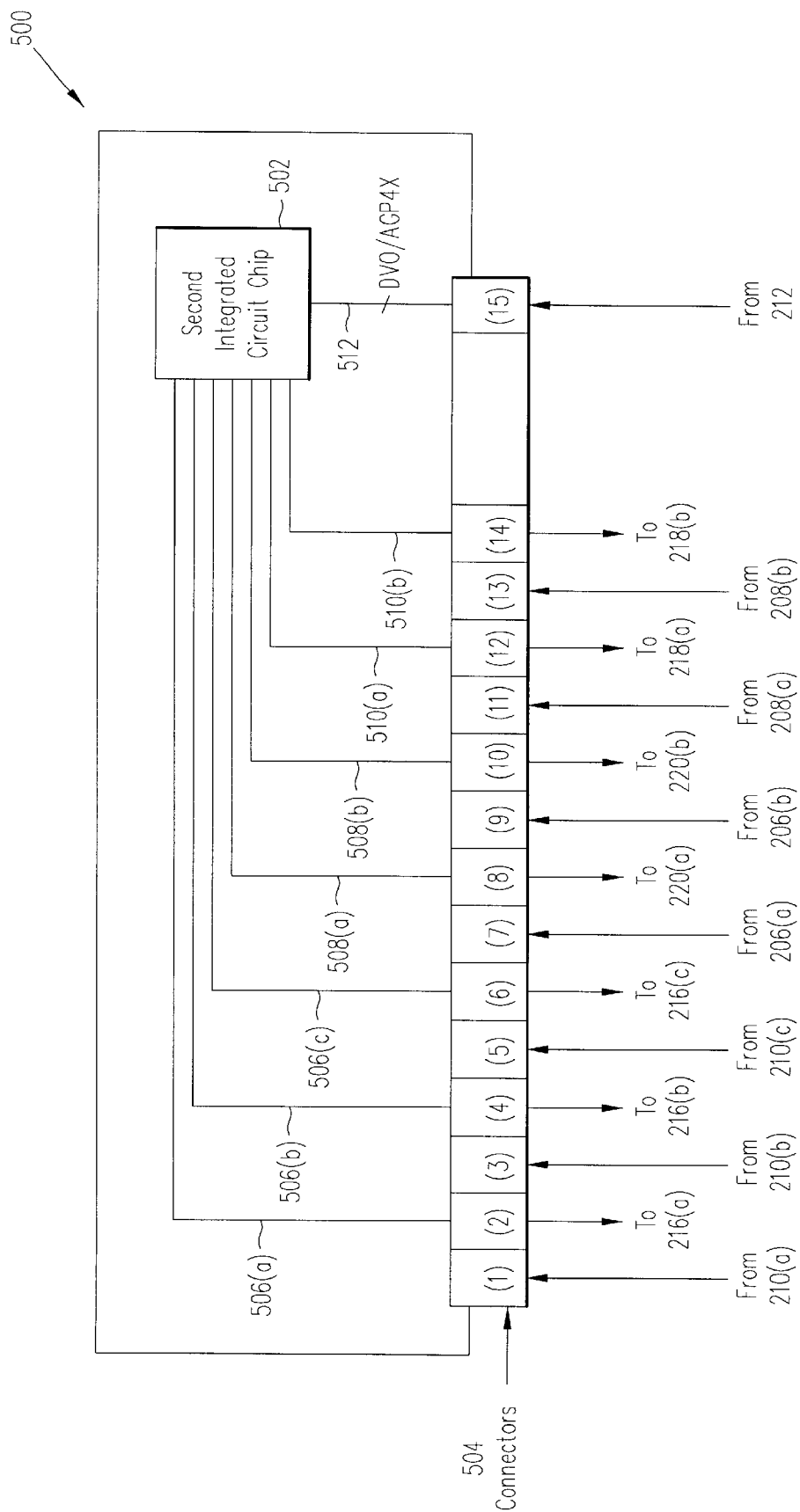
FIG. 5 is a schematic diagram illustrating a second circuit card for use in accordance with one embodiment of the present invention.

FIG. 5 is a schematic diagram illustrating a second circuit card that can be used in board connector 204 to electrically couple a second IC chip on the second, and not first chip 202 on circuit board 200, to second circuit 214.

Second circuit card 500 includes second IC chip 502 and connectors 504(1–15). In one embodiment, second chip 502 may be any graphics chip which is capable of providing signals for controlling a display electrically coupled to second circuit 214. Also, in one embodiment, connectors 504 may be flat board connectors and board connector 204 may be a flat board connector. However, in another embodiment, connectors 504 may be pin connectors while board connector 204 may be a cable connector which accepts pin connectors.

Second circuit card 500 is configured to provide conductive lines for signals from second chip 502 to second circuit 214. Thus, with the use of second circuit card 500, second circuit 214 receives signals from second chip 502 rather than first chip 202.

For example, second circuit card 500 includes conductive lines for signals 506(a), 506(b), and 506(c) which electrically couple second chip 502 to connectors 504(2), 504(4), and 504(6), respectively. Second circuit card 500 further includes conductive lines for signals 508(a), 508(b), 510(a) and 510(b) which electrically couple second chip 502 to connectors 504(8), 504(10), 504(12), and 504(14), respectively.

As further illustrated in FIG. 5, when inserted in board connector 204, connectors 504 are electrically coupled to certain signals of board connector 204. For example, connector 504(1) is electrically coupled to conductive line for signal 210(a) and 504(2) is electrically coupled to conductive line for signal 216(a). However, conductive line for signal 210(a) stops at connector 504(1), yet conductive line for signal 216(a) is electrically coupled to conductive line for signal 506(a) via connector 504(2). Similar connections apply to additional connectors 504. Thus, signals from second chip 502, and not signals from first chip 201, are transmitted to display connector 504, when second circuit card 500 is inserted into board connector 204.

Figure 6:
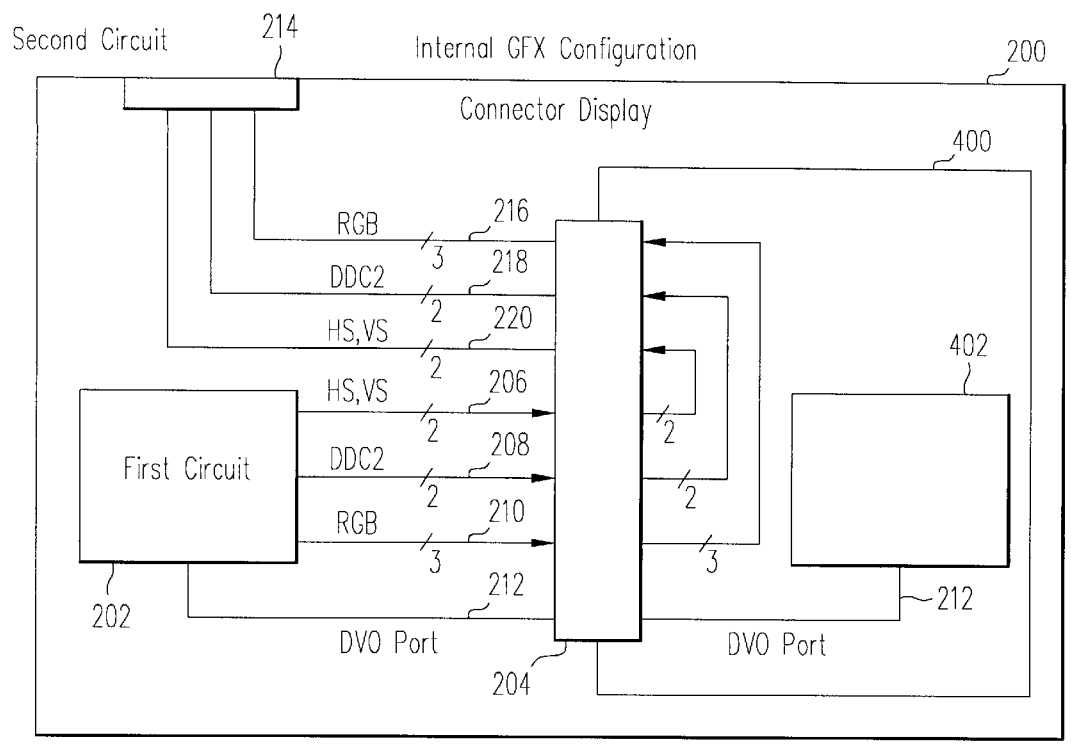
FIG. 6 is a block diagram illustrating the operation of a circuit board including a first circuit card in accordance with one embodiment of the present invention.
Figure 7:
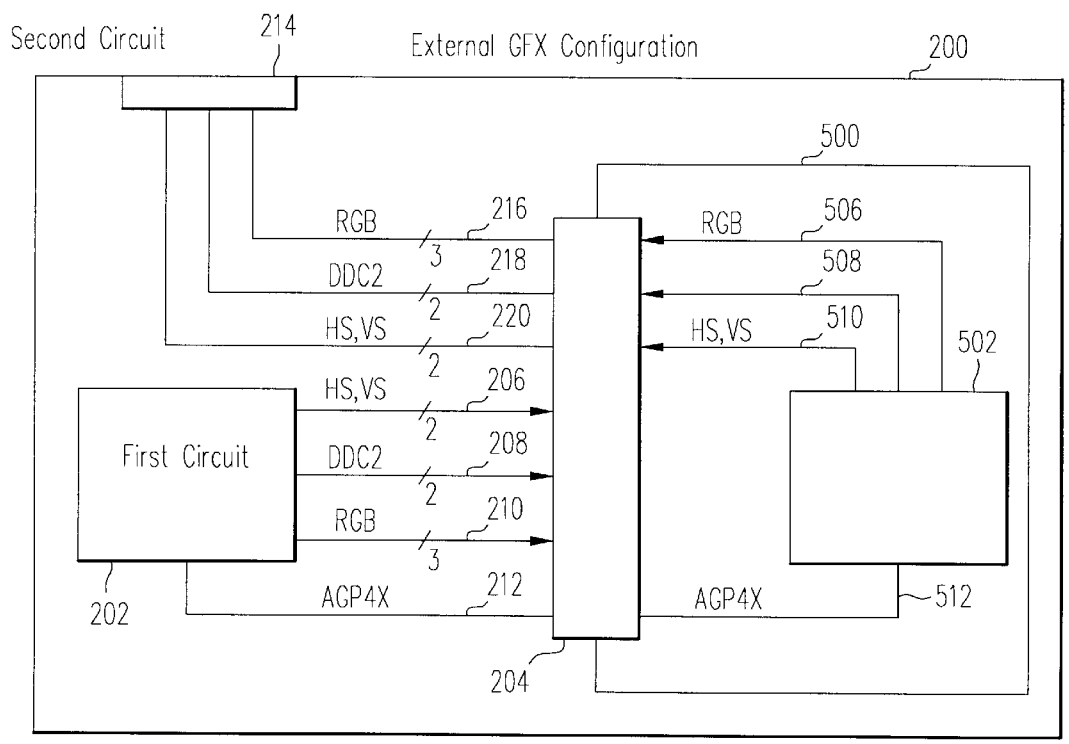
FIG. 7 is a block diagram illustrating the operation of a circuit board including a second circuit card in accordance with one embodiment of the present invention.

Turning now to FIGS. 6 and 7, the operation of circuit cards 400 and 500 will be described. FIG. 6 illustrates the signal path from first chip 202 to second circuit 214 when first circuit card 400 is inserted into board connector 204. First circuit card 400 provides the connections to electrically couple first chip 202 with second circuit 214. For example, as shown in FIG. 4, connector 404(1) is electrically coupled to signal 210(a), and connector 404(2) is electrically coupled to signal 216(a). However, because connector 404 (1) is electrically coupled to connector 404(2), signal 210(a) is electrically coupled to signal 216(a). familarly, signal 210 is electrically coupled to signal 216, signal 208 is electrically coupled to signal 218, and signal 206 is electrically coupled to signal 220. By making these connections, first chip 202 is electrically coupled with second circuit 214 without any modifications to circuit board 200.

Similarly, FIG. 7 illustrates the signal path from second chip 502 to second circuit 404 when second circuit card 500 is inserted into board connector 204. Second circuit card 500 provides the connections necessary to electrically couple second chip 502 with second circuit 214. For example, as shown in FIG. 5, connector 504(1) is electrically coupled to signal 210(a) and signal 506(a), and connector 504(2) is electrically coupled to signal 216(a). However only signal 506(a) is electrically coupled to signal 216(a). Similarly, signal 506 is electrically coupled to signal 216, signal 508 is electrically coupled to signal 218, and signal 510 electrically coupled to signal 220. By making these connections, second chip 502 is electrically coupled with second circuit 214 without any modifications to circuit board 200.

The preceding examples are included to demonstrate specific embodiments of the invention. It should be appreciated by those of skill in the art that the techniques disclosed represent techniques discovered by the inventor to function well in the practice of the invention, and thus can be considered to constitute preferred modes for its practice. However, it should be understood that the invention is not intended to be limited to the particular forms disclosed. Rather, the different aspects of the disclosed compositions and methods may be utilized in various combinations and/or independently. Those of skill in the art should, in light of the present disclosure, appreciate that many changes can be made in the specific embodiments which are disclosed and still obtain a like or similar result without departing from the spirit and scope of the invention, as defined by the appended claims.

What is claimed is:

1. An information handling system comprising:
   a circuit board;
   a connector provided on the circuit board, wherein the connector is configured to receive a first circuit card or a second circuit card;
   a first circuit provided on the circuit board and electrically coupled to the connector; and
   a second circuit provided on the circuit board and electrically coupled to the connector, wherein:
   if the first circuit card is received by the connector, a first signal path is provided from the first circuit to the second circuit via the first circuit card, and
   if the second circuit card is received by the connector, a second signal path is provided from the second circuit card to the second circuit.

2. The information handling system of claim 1, wherein the connector comprises:
   a first plurality of connection pins and a second plurality of connection pins, wherein:
   the first circuit is electrically coupled to the first plurality of connection pins, and
   the second circuit is electrically coupled to the second plurality of connection pins.

3. The information handling system of claim 1, wherein the second circuit card comprises:
   a second integrated circuit chip provided on the second circuit card.

4. The information handling system of claim 1, wherein the second circuit means is configured to electrically a display to the connector.

5. The information handling system of claim 2, wherein the first circuit card is configured to provide the first signal path by electrically coupling the first plurality of connection pins to the second connection pins.

6. The information handling system of claim 3, wherein the second circuit card is configured to provide the second signal path by electrically coupling the second integrated circuit chip to the second plurality of connection pins.

7. The information handling system of claim 5, wherein the first circuit comprises:
   a first integrated circuit chip provided on the circuit board, the first integrated circuit chip electrically coupled to the first plurality of connection pins of the connector.

8. The information handling system of claim 6, wherein the second integrated circuit chip is configured to provide to the second circuit a second plurality of display signals, including a plurality of RGB signals, a plurality of display data signals, a horizontal sync signal, and a vertical sync signal.

9. The information handling system of claim 7, wherein the first integrated circuit chip is configured to provide to the second circuit via the first circuit card a first plurality of display signals, including a plurality of RGB signals, a plurality of display data signals, a horizontal sync signal, and a vertical sync signal.

10. The information handling system of claim 7, wherein the first plurality of display signals is provided to the second circuit a long the first signal path.

11. The information handling system of claim 8, wherein the second plurality of display signals is provided to the second circuit along the second signal path.

12. A circuit interface comprising:
   a connector provided on a circuit board, wherein the connector is configured to receive a first circuit card or a second circuit card;
   a first circuit provided on the circuit board and electrically coupled to the connector; and
   a second circuit provided on the circuit board and electrically coupled to the connector, wherein:
      if the first circuit card is received by the connector, a first signal path is provided from the first circuit to the second circuit via the first circuit card, and
      if the second circuit card is received by the connector, a second signal path is provided from the second circuit card to the second circuit.

13. The circuit interface of claim 12, wherein the connector comprises:
   a first plurality of connection pins and a second plurality of connection pins, wherein:
      the first circuit is electrically coupled to the first plurality of connection pins, and
      the second circuit is electrically coupled to the second plurality of connection pins.

14. The circuit interface of claim 12, wherein the second circuit card comprises:
   a second integrated circuit chip provided on the second circuit card.

15. The circuit interface of claim 13, wherein the first circuit card is configured to provide the first signal path by electrically coupling the first plurality of connection pins to the second connection pins.

16. The circuit interface of claim 14, wherein the second circuit card is configured to provide the second signal path by electrically coupling the second integrated circuit chip to the second plurality of connection pins.

17. The circuit interface of claim 15, wherein the first circuit comprises:
   a first integrated circuit chip provided on the circuit board, the first integrated circuit chip electrically coupled to the first plurality of connection pins of the connector.

18. The circuit interface of claim 16, wherein the second integrated circuit chip is configured to provide to the second circuit a second plurality of display signals, including a plurality of RGB signals, a plurality of display data signals, a horizontal sync signal, and a vertical sync signal.

19. The circuit interface of claim 17, wherein the first integrated circuit chip is configured to provide to the second circuit via the first circuit card a first plurality of display signals, including a plurality of RGB signals, a plurality of display data signals, a horizontal sync signal, and a vertical sync signal.

20. The circuit interface of claim 17, wherein the first plurality of display signals is provided to the second circuit along the first signal path.

21. The circuit interface of claim 18, wherein the second plurality of display signals is provided to the second circuit along the second signal path.

22. An information handling system comprising:
   a circuit board, comprising:
      a first circuit and a second circuit, wherein the circuit board is configured to receive a first circuit card comprising a first IC chip or a second circuit card comprising a second IC chip; and
   a circuit interface means for electrically coupling the first IC chip to the second circuit when the first circuit card is received by the circuit board, and for electrically coupling the second IC chip to the second circuit when the second circuit card is received by the circuit board.

23. The information handling system of claim 22, wherein:
   the first circuit card further comprises a means for providing a first signal path from the first chip to the second circuit, and
   the second circuit card further comprises a means for providing a second signal path from the second chip to the second circuit.

* * * * *